(12) United States Patent
Dewakar et al.

(10) Patent No.: US 11,256,424 B2
(45) Date of Patent: Feb. 22, 2022

(54) REDUCING WRITE TAIL LATENCY IN STORAGE SYSTEMS

(71) Applicant: NetApp, Inc., Sunnyvale, CA (US)

(72) Inventors: Suganthi Dewakar, Sunnyvale, CA (US); Xing Lin, Taizhou (CN); Junji Zhi, Toronto (CA); Deepak Raghu Kenchammana-Hosekote, Mountain View, CA (US)

(73) Assignee: NETAPP, INC., Sunnyvale, CA (US)

( * ) Notice: Subject to any disclaimer, the term of this patent is extended or adjusted under 35 U.S.C. 154(b) by 80 days.

(21) Appl. No.: 16/532,817

(22) Filed: Aug. 6, 2019

(65) Prior Publication Data
US 2019/0361612 A1 Nov. 28, 2019

Related U.S. Application Data

(63) Continuation of application No. 15/064,141, filed on Mar. 8, 2016, now abandoned.

(51) Int. Cl.
*G11C 29/00* (2006.01)
*G06F 3/06* (2006.01)
(Continued)

(52) U.S. Cl.
CPC .......... *G06F 3/0611* (2013.01); *G06F 3/0659* (2013.01); *G06F 3/0689* (2013.01); *G06F 11/1076* (2013.01); *H03M 13/154* (2013.01)

(58) Field of Classification Search
CPC .... G06F 3/0611; G06F 3/0619; G06F 3/0638; G06F 3/0659; G06F 3/0683;
(Continued)

(56) References Cited

U.S. PATENT DOCUMENTS 8,074,014 B2 12/2011 Narayanan et al.
2013/0042156 A1* 2/2013 Srinivasan .......... G06F 11/2074
714/54

(Continued)

FOREIGN PATENT DOCUMENTS

CN 101599027 A 12/2009

OTHER PUBLICATIONS

Huang; et al., "Erasure Coding in Windows Azure Storage", USENIX Annual Technical Conference, Jun. 13, 2012, 12 pages.
(Continued)

*Primary Examiner* — Albert Decady
*Assistant Examiner* — Enamul M Kabir
(74) *Attorney, Agent, or Firm* — Troutman Pepper Hamilton Sanders LLP (Rochester)

(57) ABSTRACT

In order to reduce write tail latency, a storage system generates redundant write requests when performing a storage operation for an object. The storage operation is determined to be effectively complete when a minimum number of write requests have completed. For example, the storage system may generate twelve write requests and also generate four redundant write requests for a total of sixteen write requests. The storage system considers the object successfully stored once twelve of the sixteen writes complete successfully. To generate the redundant writes, the storage system may use replication or erasure coding. For replication, the storage system may issue a redundant write request for each of n chunks being written. For erasure coding, the storage system may use rateless codes which can generate unlimited number of parity chunks or use an n+k+k' erasure code which generates an additional k' encoded chunks, in place of an n+k erasure code.

12 Claims, 7 Drawing Sheets

(51) Int. Cl.
*G06F 11/10* (2006.01)
*H03M 13/15* (2006.01)

(58) Field of Classification Search
CPC ............. G06F 11/1076; G06F 12/0253; G06F 2212/1024; G06F 2212/1044; G06F 3/0689; H03M 13/154
See application file for complete search history.

(56) References Cited

U.S. PATENT DOCUMENTS

| | | | | |
|---|---|---|---|---|
| 2013/0145105 | A1* | 6/2013 | Sawicki | G06F 16/176 711/147 |
| 2014/0068320 | A1* | 3/2014 | Vedpathak | G06F 11/1076 714/6.2 |
| 2014/0122924 | A1* | 5/2014 | Kazi | G06F 21/6218 714/6.22 |
| 2015/0100966 | A1* | 4/2015 | Baptist | G06F 3/0619 718/103 |
| 2015/0193309 | A1* | 7/2015 | Khadiwala | G06F 11/3034 714/4.11 |
| 2015/0254004 | A1* | 9/2015 | Colgrove | G06F 3/0689 711/103 |
| 2016/0062834 | A1 | 3/2016 | Benight et al. | |
| 2016/0070617 | A1 | 3/2016 | Algie et al. | |
| 2016/0085629 | A1* | 3/2016 | Storm | G06F 3/0604 714/766 |
| 2016/0224403 | A1* | 8/2016 | Gladwin | G06F 11/0718 |
| 2016/0253240 | A1* | 9/2016 | Cocagne | G06F 3/0619 714/764 |

OTHER PUBLICATIONS

P.P.S. et al., "Yahoo Cloud Object Store—Object Storage at Exabyte Scale", [Online], Apr. 14, 2015, 5 pages [Retrieved from Internet on Dec. 13, 2015], http://yahooeng.tumblr.com/post/116391291701/yahoo-cloud-object-store-object-storage-at<http:><http:></http:></http:>.

Shokrollahi; A., "Raptor Codes", IEEE Transactions On Information Theory, Jun. 2006, 17 pages, vol. 52, No. 6.

* cited by examiner

REDUCING WRITE TAIL LATENCY IN STORAGE SYSTEMS

This application is a continuation of U.S. patent application Ser. No. 15/064,141 filed Mar. 8, 2016, which is hereby incorporated by reference in its entirety.

BACKGROUND

The disclosure generally relates to the field of computer storage systems, and more particularly to reducing write tail latency in a storage system.

Some storage systems store data across a number of storage devices, such as distributed storage systems or systems utilizing Redundant Array of Independent Disks ("RAID") configurations. A data object stored in a storage system with multiple storage devices may be divided into chunks with each chunk written to a different storage device. To increase durability of data, the storage system may employ replication or erasure coding. When using replication, the storage system duplicates chunks of an object and sends write requests for the duplicate chunks to additional storage devices. When using erasure coding, the storage system uses an erasure code to algorithmically generate chunks for an object. In general, an erasure code transforms a data object consisting of n chunks of data into n+k chunks, where k is a number of encoded chunks used for data protection, and allows the data object to be reconstructed from any n chunks of the n+k chunks. For example, an 8+3 erasure code, i.e. n=8 and k=3, transforms a data object of eight chunks into eleven chunks of data. The data object may then be reconstructed from any eight of the eleven chunks. There are multiple types of erasure codes including systematic and non-systematic erasure codes. With a systematic erasure code, the original (non-encoded) n chunks of the data object are written to storage devices along with k encoded chunks. With non-systematic erasure codes, all of the n+k chunks are encoded. Another type of erasure code is a rateless erasure code or fountain code. Unlike erasure codes with an n+k rate, a rateless erasure code can generate a theoretically unlimited number of chunks and still reconstruct the object using any n of the chunks.

BRIEF DESCRIPTION OF THE DRAWINGS

Aspects of the disclosure may be better understood by referencing the accompanying drawings.

DESCRIPTION

Figure 1:
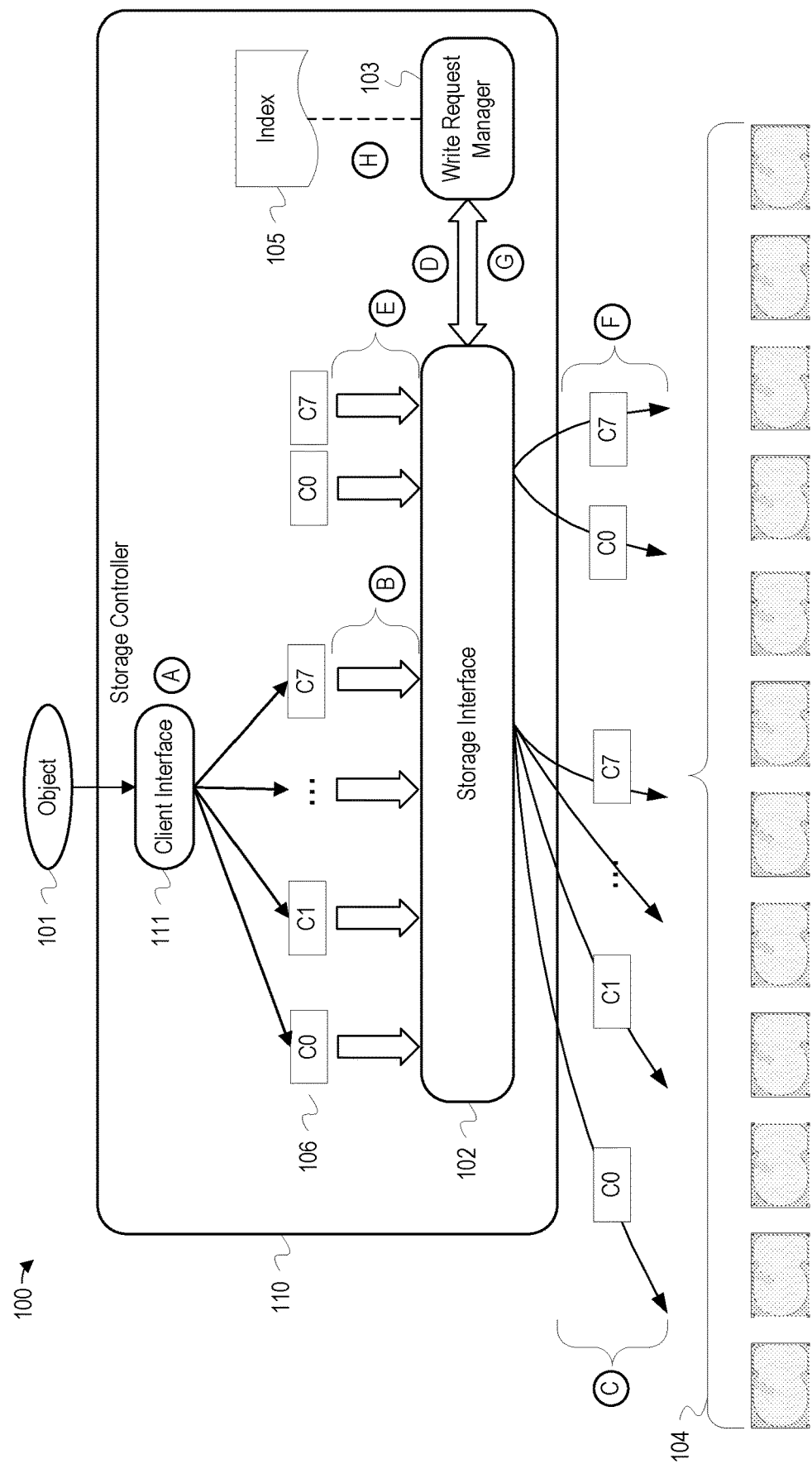
FIG. 1 depicts an example storage system that generates redundant writes to reduce write tail latency using replication.

The description that follows includes example systems, methods, techniques, and program flows that embody aspects of the disclosure. However, it is understood that this disclosure may be practiced without these specific details. For instance, this disclosure refers to types of erasure coding in illustrative examples. But aspects of this disclosure can utilize other data durability methods and other types of erasure codes such as parity blocks, Reed-Solomon encoding, Raptor codes, etc. In other instances, well-known instruction instances, protocols, structures and techniques have not been shown in detail in order not to obfuscate the description.

Terminology

This description uses the term "chunk" to refer to a discrete unit of data. A chunk may also be referred to as a fragment, segment, block, extent, data element, etc. The use of the term "chunk" does not connote any particular size or format as the size or a format of a chunk can vary based on an encoding scheme, file system, block size, etc.

This description uses the term "write request" to refer to a message instructing a storage device to store or write data. A write request may also be referred to as a write operation, write command, or write instruction. A write request complies with or is sent in accordance with different storage protocols such as Hypertext Transfer Protocol ("HTTP") REST protocol, Small Computer System Interface ("SCSI"), Internet Small Computer System Interface ("iSCSI"), etc. A write request may be sent to a storage device along with data to be stored. The storage device responds or acknowledges once the write request is complete, i.e. once the data has been stored or written to the storage device.

Introduction

When writing data to a single storage device, the period required to complete the write operation is generally predictable with a delay or latency occurring on a low percentage of writes. However, in a storage system with multiple storage devices, the chance of delay for a write request increases with the scale and complexity of the system. The occasional long delay, known as write tail latency, i.e., a latency reading that falls in the tail of its latency distribution curve, is caused by waiting for writes to complete at multiple storage devices which increases the odds of protracted write latency or failure. For example, when eight chunks of a data object are written to eight different storage devices, the data object is not acknowledged as stored until all eight storage devices have successfully written their corresponding chunk. If any of the eight storage devices has a high latency, the storage operation for the data object suffers the same latency.

Overview

In order to reduce write tail latency, a storage system with multiple storage devices ("storage system") generates redundant write requests when performing a storage operation for an object. The storage operation is determined to be effectively complete when a minimum number of write requests have completed. For example, the storage system may normally generate twelve write requests when storing the object. To decrease write tail latency, the storage system may also generate four redundant write requests for a total of sixteen write requests and consider the object successfully stored once twelve of the sixteen writes complete successfully. To generate the redundant writes, the storage system may use replication or erasure coding. For replication, the storage system may, for example, proactively issue a redundant write request for each of n chunks being written, resulting in a total of n+n writes. For erasure coding, the storage system may, for example, use an erasure code to generate an additional k' encoded chunks and generate write requests for a total of n+k+k' chunks. In some instances, the storage system may generate redundant write requests reactively by waiting for initial write requests to take longer than a threshold before generating redundant write requests.

Example Illustrations

FIG. 1 depicts an example storage system that generates redundant writes to reduce write tail latency using replication. FIG. 1 depicts a storage system 100 that includes a storage controller 110 and storage devices 104. The storage controller 110 includes a storage interface 102, a write request manager 103 ("write manager 103"), and a client interface 111.

The storage system 100 may be a distributed storage system, a RAID storage system, or other type of storage system that stores data across multiple storage devices, such as the storage devices 104. The storage controller 110 manages read and write commands for the storage system 100. The storage controller 110 communicates with the storage devices 104 through the storage interface 102. The storage interface 102 may be a SCSI, iSCSI, Advanced Host Controller Interface ("AHCI"), etc., and may communicate with the storage devices 104 through various protocols such as HTTP REST protocol, SCSI, iSCSI, etc. The storage interface 102 may be connected to the storage devices 104 through a local or remote connection or a hybrid of both local and remote connections. For example, the storage interface 102 may communicate with some of the storage devices 104 over a local area network and others of the storage devices 104 over a wide area network. Also, the storage interface 102 may, for example, communicate with the storage devices 104 through local connections such as Serial Advanced Technology Attachment ("SATA") connections, SCSI connections, etc.

At stage A, the client interface 111 of the storage system 100 receives the object 101. The client interface 111 may receive the object 101 from a storage system client, an application or backup agent, another storage system, etc. The object 101 may be received along with a write command instructing the storage system 110 to store the object 101. In response to receiving the object 101, the client interface 111 or another component of the storage controller 110 divides the object 101 into the chunks 106 for storage. The number and size of the chunks 106 can vary based on the configuration of the storage system 100 or the storage controller 110, a size of the object 101, a number of the storage devices 104, etc. For example, if the storage devices 104 include four storage devices, the object 101 may be divided into four or fewer larger chunks. In FIG. 1, the chunks 106 consist of eight chunks, C0-C7.

At stage B, the write manager 103 sends write requests for the chunks 106 to the storage interface 102. The write manager 103 is a component that generates and monitors write requests for objects received by the storage system 100. In various instances, the functionality of the write manager 103 may be incorporated within the storage interface 102, implemented using software or hardware, etc. In FIG. 1, the write manager 103 generates write requests for the chunks C0-C7. The write manager 103 generates write requests in a protocol that is compatible with the storage interface 102, such as HTTP REST protocol, SCSI, iSCSI, etc.

At stage C, the storage interface 102 sends the write requests and the corresponding chunks 106 to the storage devices 104. The storage devices 104 may consist of or include multiple types of storage devices such as hard disks, all flash arrays, tape storage, etc. The storage devices 104 may also be clusters, nodes, or logical volumes that comprise hard disks, all flash arrays, tape storage, etc. FIG. 1 depicts the storage devices 104 as including twelve storage devices; however, the number of storage devices in the storage devices 104 can vary. The storage interface 102 sends each chunk of the chunks 106 and the corresponding write request to a different storage device of the storage devices 104 for storage, i.e. the eight chunks are sent to eight different storage devices. The storage interface 102 may select which of the storage devices 104 receive chunks based on a logical or physical ordering of the storage devices 104, a RAID configuration, past performance of the storage devices 104, write queues, etc. For example, the storage interface 102 may prioritize storage devices that have shorter write queues or that previously performed write requests faster or more reliably. Each of the storage devices 104 which received one of the chunks 106 attempts to store the chunk as indicated by the corresponding write request. The storage devices 104 acknowledge to the storage interface 102 once a write request is completed successfully.

After sending the chunks 106 and the write requests to the storage devices 104, the storage interface 102 begins tracking the period between when the request(s) were sent and when the recipient storage devices confirm completion of the write(s). If the period meets or exceeds a threshold, the storage interface 102 determines which of the chunks 106 have not been stored successfully. The threshold is a configurable time period or number of cycles and may be adjusted according to how much delay for a write request is acceptable for the storage system 100. Additionally, the threshold may be dynamically adjusted for each write request based on the size of chunks being written, the load of the storage system 100, or the type of storage devices in the storage devices 104. For example, the threshold may increase in proportion to an increase in a size of chunks or decrease if faster storage devices, such as solid state devices or all flash arrays, are being used.

At stage D, the storage interface 102 indicates to the write manager 103 that the write requests for chunk C0 and chunk C7 of the chunks 106 have not completed within the threshold period. Once the threshold has been met or exceeded, the storage interface 102 identifies those of the chunks 106 which were not successfully stored or whose write requests failed to complete. In the example of FIG. 1, the storage interface 102 determines that chunks C0 and C7 of the chunks 106 were not successfully stored within the threshold and indicates this information to the write manager 103. The storage interface 102 may indicate the information by sending identifiers for the chunks C0 and C7 or forwarding information included in the corresponding write requests such as an identifier for the write requests. The storage interface 102 may also log which storage devices of the storage devices 104 failed to acknowledge within the threshold for future prioritization of the storage devices 104.

At stage E, the write manager 103 sends the redundant write requests for chunk C0 and chunk C7 of the chunks 106 to the storage interface 102. In FIG. 1, the write manager 103 uses replication to generate the redundant write requests by duplicating the initial write requests for chunks C0 and C7. The write manager 103 may modify the redundant write requests to indicate that the chunks C0 and C7 should be sent to different storage devices of the storage devices 104. For example, if chunk C0 was originally sent to a storage device A of the storage devices 104, the write manager may indicate in the redundant write request for chunk C0 that the chunk should not be sent to the storage device A for storage. Alternatively, the write manager 103 may specify a storage device for the chunk C0 other than the storage device A or may rely on the storage interface 102 to select a different storage device of the storage devices 104.

At stage F, the storage interface 102 sends the redundant write requests for chunk C0 and chunk C7 of the chunks 106 to the storage devices 104. The storage interface 102 attempts to write the chunks C0 and C7 in a manner similar to that described at stage C. However, the storage interface 102 ensures that the chunks C0 and C7 are sent to different storage devices of the storage devices 104 than those of stage C. As a result, there will be two pending write requests for each of the chunk C0 and the chunk C7: the initial write request at stage C and the redundant write request at stage F. The storage interface 102 waits for either of the storage devices associated with the pending write requests to acknowledge that the associated chunk was stored successfully. In other words, the storage interface 102 utilizes the storage device that is quickest to respond. For example, the initial write request for chunk C0 may respond before the redundant write request, and the redundant write request for chunk C7 may respond before the original write request.

Similar to stage C, the storage interface 102 may track the period between when the pending request(s) were sent and when the recipient storage devices confirm completion of the write(s). If no write requests, either the original or redundant, respond within the threshold, the storage interface 102 may again indicate to the write manager 103 those write requests which failed to complete within the threshold.

Once the storage interface 102 receives a successful storage indication for each of the chunks 106, the storage interface 102 may cancel or preempt remaining write requests. Since a single storage location is used for each chunk of the chunks 106, additional write requests for a chunk that has already been stored may be unnecessary and may be canceled. For example, if an initial write request responds before a redundant write request, the storage interface 102 may cancel the redundant write request or preempt the redundant write request. Alternatively, the storage interface 102 may allow the write request to complete but mark the location as deleted or mark the location for later garbage collection.

At stage G, the storage interface 102 indicates locations of the chunks 106 to the write manager 103. The location for each chunk includes an identifier for the storage device on which the chunk is stored and a memory or storage address for the chunk. The identifier for the storage device may be a logical volume number, a disk name, network address, etc. The addresses for the chunks may be physical or virtual addresses. The storage interface 102 may receive the locations for the chunks 106 in response to the write requests, or the storage interface 102 may request the location for each of the chunks 106 from the associated storage device of the storage devices 104.

At stage H, the write manager 103 writes the locations of the chunks 106 to the index 105 and indicates that the object 101 was stored successfully. The index 105 may be a database, a log or table maintained in memory, etc. Although depicted as part of the storage controller 110, the index 105 may be maintained remotely on a server or connected storage device. The write manager 103 stores an identifier for the object 101 along with the locations of the chunks 106 in the index 105. Once the locations and the identifier have been stored, the write manager 103 may respond to a write command for the object 101 indicating that the object 101 was stored successfully in the storage system 100.

When a request to read the object 101 is received by the storage system 100, the storage controller 110 uses an identifier for the object 101 to lookup the locations of the chunks 106 in the index 105. The storage controller 110 can then use the location information to submit read requests to the storage interface 102, or may use the location information to read the chunks 106 from the storage devices 104 directly. The storage controller 110 then reconstructs the object 101 by combining the chunks 106 and responds to the read request with the object 101.

In FIG. 1, the write manager 103 stores the locations of the chunks 106 in the index 105. In some instances, the locations for the chunks 106 may be prepended or appended to some or all of the chunks 106 in the storage devices 104. For example, after storing each of the chunks 106, the storage interface 102 may lazily (i.e., in write-back fashion) issue additional write requests to append the locations to each of the chunks 106, or the storage interface 102 may reserve space at the beginning of chunks to be updated with the locations of the chunks 106. The storage interface 102 may maintain a mapping between an identifier for the object 101 and a location of one of the chunks 106. The identifier for the object 101 may then be used to read the locations for the remaining chunks 106.

The storage system 100 described in FIG. 1 generates redundant write requests in a reactive manner in that the storage system 100 waits for a write request to fail to complete within a time threshold before generating and sending redundant write requests. In some instances, the storage system 100 may proactively generate redundant writes in that redundant write requests are generated concurrently with the initial write requests. Additionally, the storage interface 102 may concurrently send the initial write requests and the redundant write requests to the storage devices 104. For example, in addition to the eight write requests generated at stage C for the chunks 106, the write manager 103 in a proactive implementation may also generate eight redundant write requests for the chunks 106 for a total of sixteen write requests. The storage interface 102 sends the sixteen write requests and then utilizes the first write request to complete for each of the chunks 106.

FIG. 1 is annotated with a series of numbers A-H. These numbers represent stages of operations. Although these stages are ordered for this example, the stages illustrate one example to aid in understanding this disclosure and should not be used to limit the claims. Subject matter falling within the scope of the claims can vary with respect to the order and some of the operations.

Figure 2:
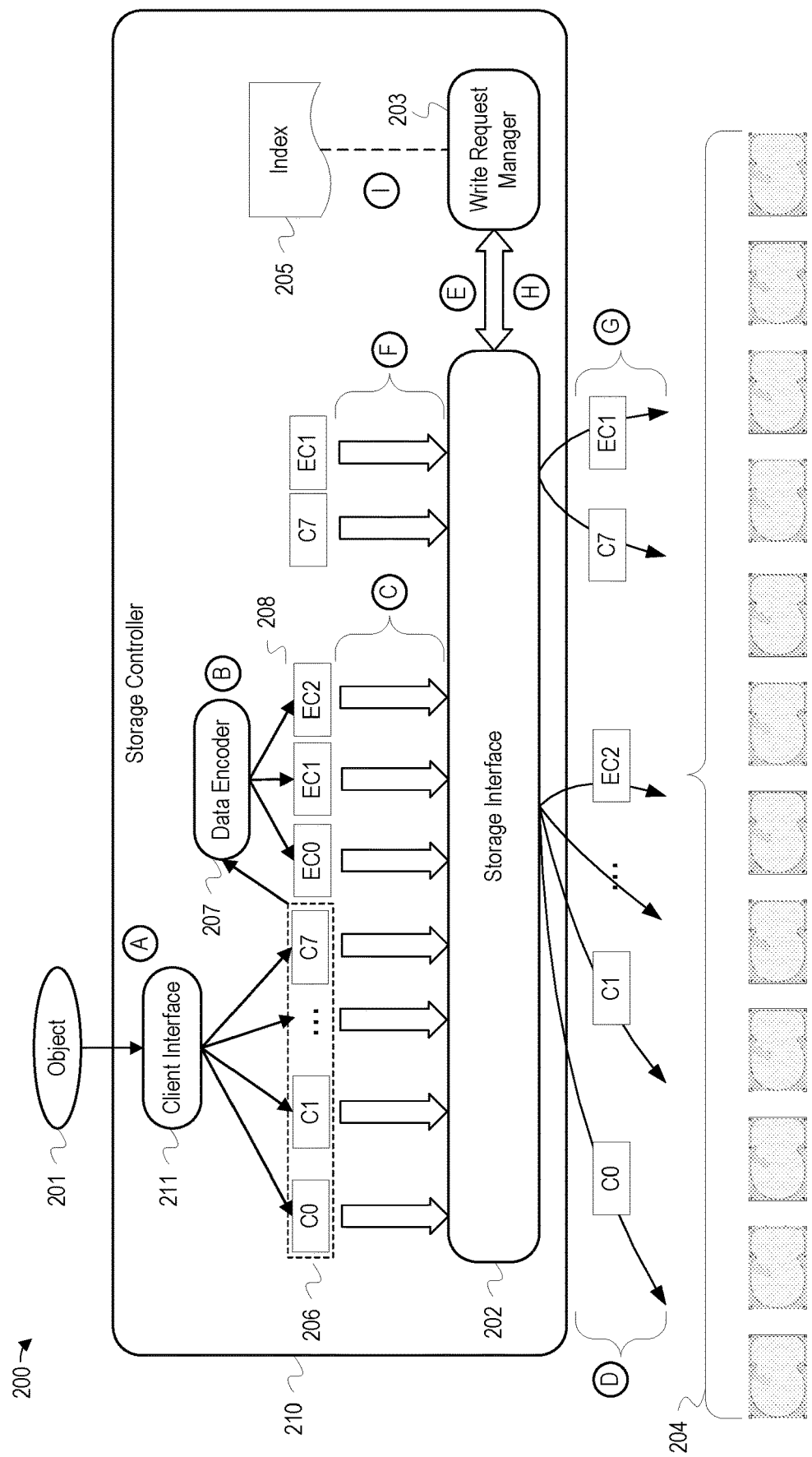
FIG. 2 depicts an example storage system that generates redundant writes to reduce write tail latency using an erasure code and replication.

FIG. 2 depicts an example storage system that generates redundant writes to reduce write tail latency using an erasure code and replication. FIG. 2 depicts a storage system 200 that includes a storage controller 210 and storage devices 204. The storage controller 210 includes a storage interface 202, a write request manager 203 ("write manager 203"), a data encoder 207, and a client interface 211.

At stage A, the client interface 211 receives the object 201 and divides the object 201 into chunks 206 in a manner similar to that described at stage A of FIG. 1. The client interface 211 also sends the chunks 206 to the data encoder 207.

At stage B, the data encoder 207 generates encoded chunks 208 including encoded chunks EC0, EC1, and EC2 based on the chunks 206. In FIG. 2, the data encoder 207 encodes the encoded chunks 208 using a systematic erasure code. The systematic erasure code uses a rate of 8+3 meaning that the object 201 may be recreated using any eight of the eleven chunks including the chunks 206 and the encoded chunks 208. In some instances, the data encoder 207 may encode the encoded chunks 208 using a rateless erasure code and may generate more than three chunks for the encoded chunks 208. Additionally, in other instances, the data encoder 207 may generate the encoded chunks 208 using another data durability technique such as parity blocks or generate the encoded chunks 208 in accordance with a RAID configuration.

At stage C, the write manager 203 sends write requests for the chunks 206 and the encoded chunks 208 to the storage interface 202, and at stage D, the storage interface 202 forwards the write requests to the storage devices 204. These operations are performed in a manner similar to that described at stages B and C of FIG. 1.

At stage E, the storage interface 202 indicates to the write manager 203 that the write requests for chunk C7 of the chunks 206 and encoded chunk EC1 of the encoded chunks 208 did not complete within a time threshold. The storage interface 202 monitors the write requests and reports to the write manager 203 in a manner similar to that described at stage D of FIG. 1.

At stage F, the write manager 203 sends redundant write requests for chunk C7 of the chunks 206 and encoded chunk EC1 of the encoded chunks 208 to the storage interface 202. Similar to stage E of FIG. 1, the write manager 203 uses replication to generate the redundant write requests, so the write manager 203 replicates the initial write requests for chunk C7 and encoded chunk EC1.

At stage G, the storage interface 202 sends write requests for the chunks 206 and the encoded chunks 208 to the storage interface 202, and at stage H, the storage interface 202 indicates locations of the chunks 206 to the write manager 203. At stage I, the write manager 203 writes the locations of the chunks 206 and the encoded chunks 208 to the index 205 and indicates that the object 201 was stored successfully. These operations are performed in a manner similar to that of stages F-H of FIG. 1.

Similar to the storage system 100 of FIG. 1, the storage system 200 generates redundant write requests in a reactive manner in that the storage system 200 waits for a write request to fail to complete within a time threshold before generating and sending redundant write requests. In some instances, the storage system 200 may proactively generate redundant write requests that are sent to the storage devices 204 concurrently with the initial write requests. For example, in addition to the eleven write requests generated at stage C for the chunks 206, the write manager 203 in a proactive implementation may also generate eleven redundant write requests for the chunks 206 for a total of twenty-two write requests. Alternatively, as described in more detail in FIG. 3, the data encoder 207 may use an erasure code to generate an additional k' chunks at stage B, and the write manager 203 may concurrently generate and send n+k+k' write requests to the storage devices 204.

FIG. 2 is annotated with a series of numbers A-I. These numbers represent stages of operations. Although these stages are ordered for this example, the stages illustrate one example to aid in understanding this disclosure and should not be used to limit the claims. Subject matter falling within the scope of the claims can vary with respect to the order and some of the operations.

Figure 3:
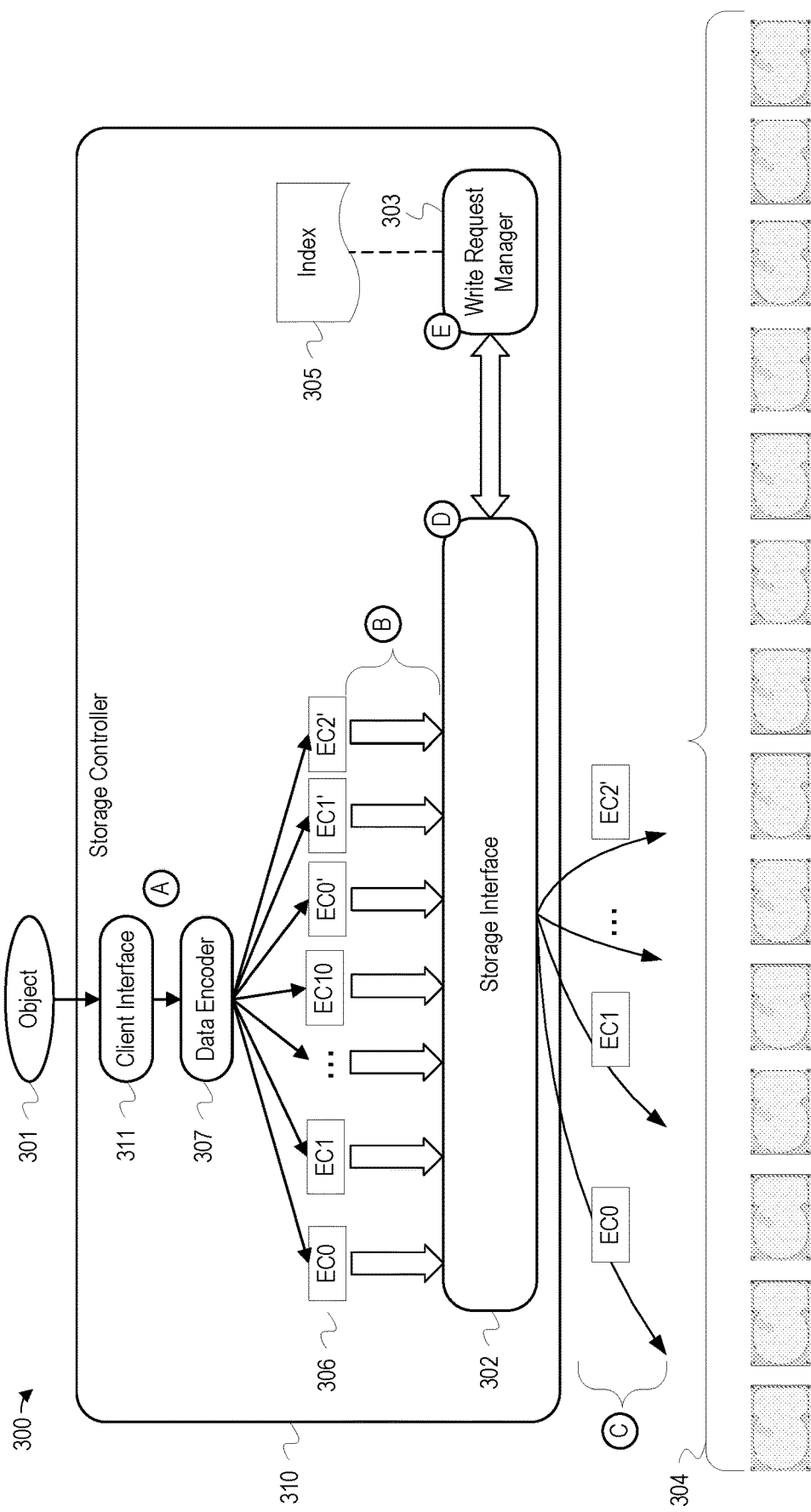
FIG. 3 depicts an example storage system that generates redundant writes to reduce write tail latency using an erasure code.

FIG. 3 depicts an example storage system that generates redundant writes to reduce write tail latency using an erasure code. FIG. 3 depicts a storage system 300 that includes a storage controller 310 and storage devices 304. The storage controller 310 includes a storage interface 302, a write request manager 303 ("write manager 303"), a data encoder 307, and a client interface 311.

At stage A, the client interface 311 receives the object 301 and sends the object 301 to the data encoder 307 to generate the encoded chunks 306. Although not depicted, the client interface 311 may divide the object 301 into a number of chunks prior to sending the chunks to the data encoder 307. In FIG. 3, the data encoder 307 uses a non-systematic erasure code to encode the object 301 to create the encoded chunks 306. The storage system 300 may be configured to provide a specified n+k rate for data durability purposes or to comply with service level agreements. Even though the effective rate is n+k, the data encoder 307 may generate more than n+k chunks. The additional chunks may be referred to as k' for a total of n+k+k' chunks. The data encoder 307 may generate the k' chunks using an erasure coding algorithm with more than k parity chunks or a rateless erasure code. When a rateless erasure code is used, a theoretically unlimited number of k' parity chunks may be generated. The value of k' may be a configured value smaller than the number of the storage devices 304, may vary so that n+k+k' is equal to the number of the storage devices 304, or may vary in response to conditions of the storage system 300 such as a high or low volume of write requests. In FIG. 3, the storage system 300 provides a rate of 8+3 meaning that the object 301 may be recreated using any eight of the encoded chunks 306. While only eleven chunks are needed for an 8+3 rate, the data encoder 307 generates fourteen chunks for the encoded chunks 306 (i.e., n+k+k'=8+3+3) using an 8+6 encoding algorithm or a rateless erasure code algorithm. The encoded chunks 306 include chunks EC0-EC10, EC0', EC1', and EC2'.

At stage B, the write manager 303 sends write requests for the encoded chunks 306 to the storage interface 302, and at stage C, the storage interface 302 forwards the write requests for the encoded chunks 306 to the storage devices 304. These operations are performed in a manner similar to that described at stages B and C of FIG. 1. However, unlike the example storage system of FIGS. 1 and 2 which reactively generate redundant write requests, the write manager 303 of the storage system 300 proactively generates redundant write requests. The write manager generates write requests for all fourteen of the encoded chunks 306 even though eleven chunks is the minimum number of chunks required to be stored to provide the rate of 8+3. So, the write requests for the chunks EC0', EC1', and EC2' may be considered to be redundant write requests.

At stage D, the storage interface 302 waits for a first eleven of the chunks 306 to be stored in the storage devices 304. Since the storage system 300 provides an effective rate 8+3, the storage interface 302 does not wait for all fourteen write requests to complete. Instead, the storage interface 302 monitors the write requests and waits for eleven of the write requests for the encoded chunks 306 to acknowledge. The storage interface 302 indicates to the write manager 303 locations for the eleven chunks that were successfully stored.

At stage E, the write manager 303 writes the locations of the encoded chunks 306 to the index 305 and indicates that the object 301 was stored successfully in a manner similar to that described at stage H of FIG. 1.

Although FIG. 3 depicts the data encoder 307 as using a non-systematic erasure code, other types of erasure codes may be used. In some instances, the data encoder 307 may use a systematic rateless erasure code and generate n+k+k' chunks with n of the chunks being non-encoded data from the object 301. In other instances, the data encoder 307 may use regular (non-rateless) erasure codes to generate n+k+k' chunks. For example, if the storage system 300 is configured to provide an effective rate of 6+2, the data encoder 307 may use an erasure code with a rate of 6+4, so k' would have a value of two. In such an implementation, the storage interface 302 waits for eight of the ten total chunks to write successfully.

In some instances, the storage system 300 may reactively generate redundant writes using similar techniques as those described in FIGS. 1 and 2. For example, the storage system 300 may initially generate n+k write requests and not issue redundant write requests for the k' chunks. Instead, the write manager 303 may generate redundant write requests using the k' chunks in response to some of the n+k write requests not completing within a time threshold. So, in the illustration of FIG. 3, the storage system 300 would initially generate write requests for the chunks EC0-EC10 of the chunks 306. If, for example, the write requests for the chunks EC8 and EC9 failed to respond within the threshold period, the storage system 300 would then generate redundant write requests with the chunks EC0' and EC1'.

FIG. 3 is annotated with a series of numbers A-E. These numbers represent stages of operations. Although these stages are ordered for this example, the stages illustrate one example to aid in understanding this disclosure and should not be used to limit the claims. Subject matter falling within the scope of the claims can vary with respect to the order and some of the operations.

Figure 4:
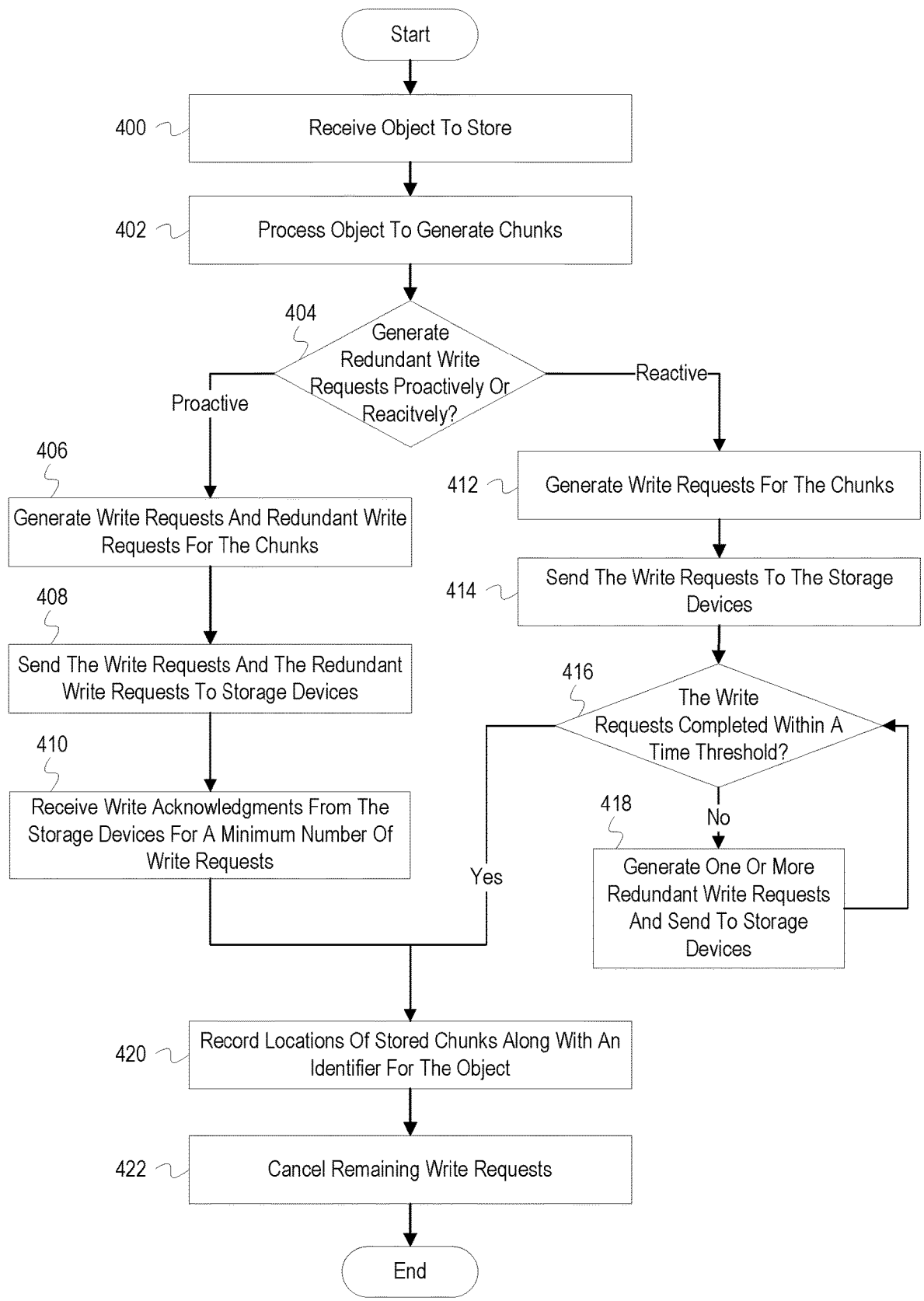
FIG. 4 depicts a flowchart illustrating example operations for storing an object in a storage system using redundant write requests.

FIG. 4 depicts a flowchart illustrating example operations for storing an object in a storage system using redundant write requests. The operations described in FIG. 4 are described as being performed by a storage system, such as the example storage systems depicted in FIGS. 1, 2, and 3.

At block 400, a storage system receives an object to be stored. The storage system may receive the object from a storage system client, an application or backup agent, etc. The object along with a request to store the object may be received via various communication protocols, such as HTTP REST protocols, iSCSI, etc. After the storage system receives the object, control flows to block 402.

At block 402, the storage system processes the object to generate chunks. The storage system may generate the chunks by dividing the object, using an erasure code, using block codes, etc. The chunks may include non-encoded data of the object, encoded data blocks, parity blocks, or other data used for data durability. The size and number of the chunks may vary based on a size of the object, a type of an erasure code used to generate the chunks, a type of data protection scheme, a number of storage devices in the storage system, and/or a configuration of the storage devices in the storage system. For example, the storage system may divide the object into chunks that are sized to be compatible with a block size used by the storage devices or file system of the storage system. When using erasure codes, the storage system may generate a number of chunks to satisfy an n+k rate of the erasure code, or may generate n+k+k' chunks as described in FIG. 3. After the storage system generates the chunks, control flows to block 404.

At block 404, the storage system determines whether redundant write requests should be generated proactively or reactively. The storage system may determine whether to generate redundant write requests proactively or reactively based on a configuration setting or may dynamically determine whether to generate redundant write requests proactively or reactively based on a state or condition of the storage system. For example, the storage system may determine to generate redundant write requests reactively if a total number of pending write requests in the storage system or in a queue exceed a threshold. Additionally, the storage system may track a number of redundant write requests that are reactively generated as objects are stored in the storage system. If the average number of reactive write requests exceed a threshold, the storage system may switch to proactively generating redundant write requests to attempt to reduce the amount of time taken to store an object. If the storage system determines that redundant write requests should be generated reactively, control flows to block 410. If the storage system determines that redundant write requests should be generated proactively, control flows to block 406.

At block 406, the storage system generates write requests and redundant write requests for the chunks. The write requests and redundant write requests conform to the protocols supported by the storage devices, such as SCSI, iSCSI, HTTP REST protocols, etc. The number of write requests and redundant write requests varies based on the number of chunks and the technique used to generate the chunks at block 404. For example, the storage system may divide the object into eight chunks and may not generate any additional chunks for data durability. In such an instance, the storage system generates eight write requests and uses replication to generate eight redundant write requests. As an additional example, the storage system may use an 8+3 erasure code to generate eleven chunks and generate eleven corresponding write requests. Furthermore, the storage system may also use replication to generate eleven redundant write requests for a total of twenty-two write requests. In some other instances, the storage system may use an n+k+k' erasure code or a rateless erasure code to generate n+k+k' chunks and generate n+k write requests and k' redundant write requests. After the storage system generates the write requests and the redundant write requests, control flows to block 408.

At block 408, the storage system sends the write requests and the redundant write requests to storage devices. The write requests and the redundant write requests are each sent with their corresponding chunk to a different storage device of the storage system. The storage system may log the storage devices which received write requests or maintain write queues for each storage device. The storage system may use the log or write queues to load balance or select which storage devices receive write requests. After the storage system sends the write requests and the redundant write requests to the storage devices, control flows to block 410.

At block 410, the storage system receives write acknowledgments for a minimum number of write requests. The storage system does not wait for all write requests to acknowledge that they completed successfully. Instead, the storage system waits for the minimum number of write requests to complete, i.e. the storage system waits for the necessary number of chunks to be stored. For example, if the storage system generated n+k+k' write requests, the storage system waits for the n+k write requests that are quickest to complete. The minimum number of write requests is equal to the minimum number of chunks that should be stored so that the object can be reconstructed at a later time. In instances where the storage system generates the redundant write requests using replication, the minimum number of write requests is equal to the number of chunks. However, the storage system ensures that the minimum total includes at least one write acknowledgement for each of the different chunks. If both a write request and a redundant write request for the same chunk complete simultaneously or complete before other chunks are stored, the storage system may ignore one of the requests or may use both storage locations to increase data durability. After the storage system receives acknowledgments for the minimum number of write requests, control flows to block 420.

Control flowed to block 412 if the storage system determined at block 404 that redundant write requests should be generated reactively. At block 412, the storage system generates write requests for the chunks. The storage system may generate write requests for all or a portion of the chunks. For example, if the storage system generated n+k+k' chunks, the storage system may initially generate write requests for just n+k chunks. In instances where the object is divided into chunks without encoding, the storage system generates a write request for each of the chunks as each chunk should be stored in the storage devices for later reconstruction of the object. After the storage system generates the write requests, control flows to block 414.

At block 414, the storage system sends the write requests to the storage devices. The storage system sends the write requests in a manner similar to that described at block 408. The storage system logs the storage devices which received write requests so that any redundant write requests that may be generated at block 418 may be sent to storage devices that did not initially receive a write request. After the storage system sends the write requests to the storage devices, control flows to block 416.

At block 416, the storage system determines whether all the write requests completed within a threshold period. After sending the write requests to the storage devices at block 414, the storage system begins tracking an amount of time until a write acknowledgement is received from each of the storage devices which received a write request. Once the amount of time is equal to or greater than the threshold period, the storage system determines the number of write requests that have failed to acknowledge. The time threshold is a configurable amount of time and may be adjusted according to how much delay for a write request is acceptable for the storage system or a particular use case. For example, the threshold may be 10 milliseconds. Additionally, the threshold may be dynamically adjusted for each write request based on the size of chunks being written, the load of the storage system, the number of writes in the write queues, and/or the type of storage devices in the storage devices. For example, the threshold may increase in proportion to the number of writes requests in the write queues. In some instances, the storage system may identify and log which storage devices completed or failed to complete their write request within the threshold. The storage system may use this information to prioritize which storage devices receive future write requests. For example, if a storage device failed to complete within the threshold on two consecutive write requests, the storage system may redirect write requests for that storage device to a different storage device. If the storage system determines that all the write requests completed within the time threshold, control flows to block 420. If the storage system determines that some of the write requests did not complete within the time threshold, control flows to block 418.

At block 418, the storage system generates redundant write requests and sends the redundant write requests to the storage devices. The number of redundant write requests is equal to the number of the write requests that failed to complete within the threshold. In some instances, the storage system may generate redundant write requests for the same chunks whose write requests failed to complete within the threshold. Alternatively, in other instances, the technique for generating the redundant write requests may vary based on how the chunks were generated at block 404. If, for example, the storage system used an n+k+k' erasure code, the storage system may use the k' chunks to generate redundant write requests. If, for example, storage system used a rateless erasure code, the storage system may generate additional chunks and issue write requests for the additional chunks. After generating and sending the redundant write requests to the storage devices, control returns to block 416, and the storage system begins tracking an amount of time for the redundant write requests to acknowledge. Additional redundant write requests may be generated if the redundant write requests also fail to complete within the time threshold.

Control flowed to block 420 if the storage device received write acknowledgments for the minimum number of write requests at block 410 or if the storage device determined that the write requests completed within the time threshold at block 416. At block 420, the storage system records locations of stored chunks along with an identifier for the object. The stored chunks are those chunks whose write requests acknowledged the quickest at block 410 or whose write requests completed within the time threshold at block 416. The location for each of the stored chunks includes an identifier for the storage device on which the chunk is stored and an address for the chunk. The storage system may record the locations in a database, a log or table maintained in memory, persistent storage, etc. The storage system associates the locations with the identifier for the object. The identifier may be a unique identifier assigned by the storage system or an identifier received with the request to store the object in the storage system. After the storage system records the locations of the stored chunks, control flows to block 422.

At block 422, the storage system cancels remaining write requests. The remaining write requests are those that failed to complete before the minimum number of write requests at block 410 or failed to complete within the time threshold at block 416. Since the remaining write requests are no longer needed, the storage may cancel the remaining write requests by issuing a cancellation request to the associated storage devices, removing them from the write queues, etc. Additionally, if the remaining write requests complete, the storage system may mark storage locations for the remaining write requests as deleted or mark the storage locations for garbage collection. After the storage system cancels remaining write requests, the process ends.

Figure 5:
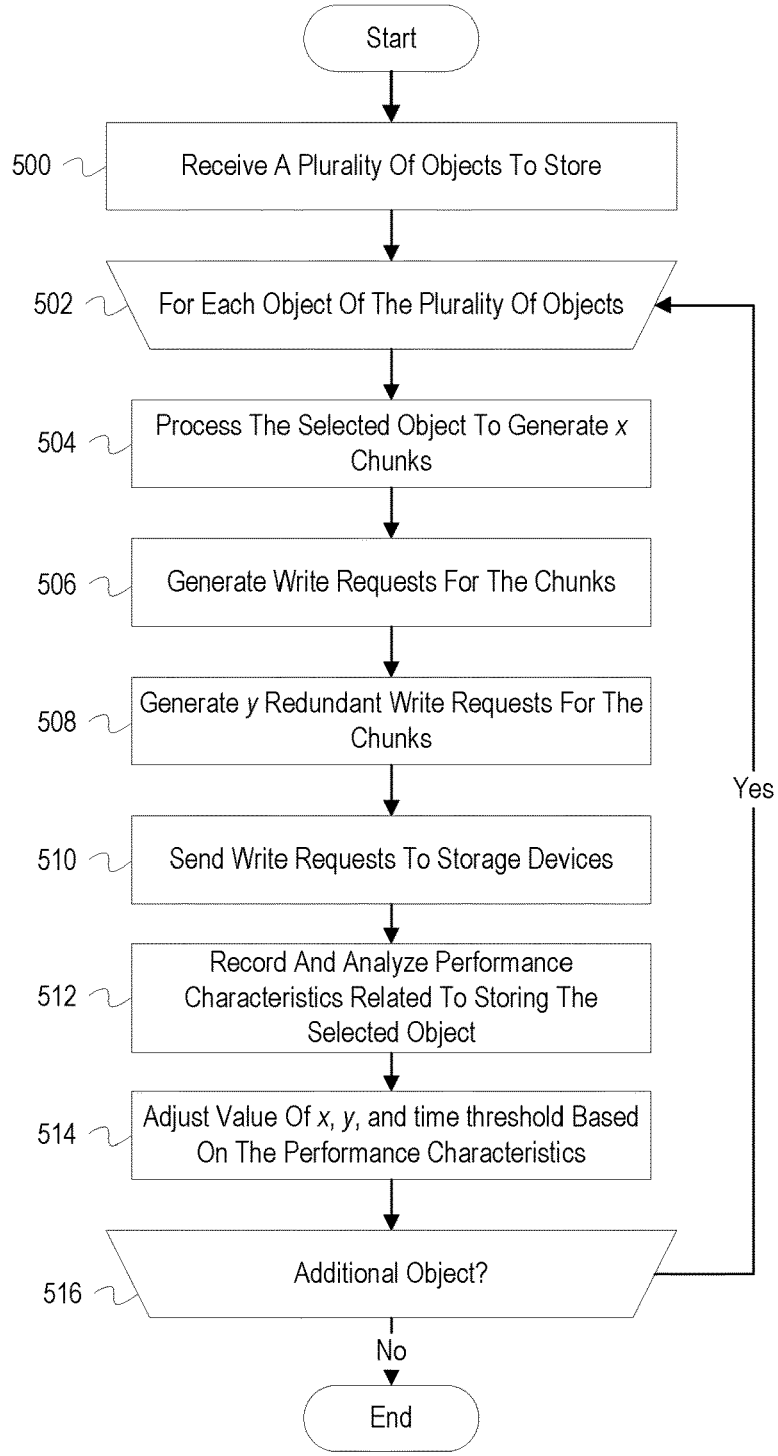
FIG. 5 depicts a flowchart that illustrates example operations for storing an object in a storage system using a dynamic number of redundant write requests.

FIG. 5 depicts a flowchart that illustrates example operations for storing an object in a storage system using a dynamic number of redundant write requests. The operations described in FIG. 5 are described as being performed by a storage system, such as the example storage systems depicted in FIGS. 1, 2, and 3.

At block 500, the storage system receives a plurality of objects to store. The plurality of objects may be received concurrently or over a period of time. The storage system may perform the operations described at blocks 502-518 as objects are received over the period of time. After the storage system receives the plurality of objects, control flows to block 502.

At block 502, the storage system begins storage operations for the plurality of objects. An object of the plurality of objects currently being stored is hereinafter referred to as the selected object. After the storage system selects the selected object, control flows to block 504.

At block 504, the storage system processes the selected object to generate x chunks. The storage system may process the selected object to generate the x chunks in a manner similar to that described at block 402 of FIG. 4. For example, the storage system may generate the x chunks using an erasure code. The value of x is configurable and may be adjusted based on performance characteristics as described at block 514. When using an erasure code, the storage system may adjust the rate of the erasure code so that n+k or n+k+k' is equal to the value of x or use a rateless erasure code to generate x chunks. After the storage system generates x chunks, control flows to block 506.

At block 506, the storage system generates write requests for the chunks. The storage system issues write requests for a minimum number of the chunks that should be stored in order to allow the selected object to be reconstructed at a later time. For example, if the storage system is configured to provide a rate of n+k for data durability, the number of chunks that should be stored, and therefore the minimum number of write requests, is equal to n+k. The number of write requests may not be equal to x in instances where additional chunks are generated and reserved for redundant write requests. For example, when x is equal to generate n+k+k', the storage system generates n+k write requests and k' chunks are reserved for potential redundant write requests. After the storage system generates the write requests, control flows to block 508.

At block 508, the storage system generates y redundant write requests for the chunks. As described in more detail at block 514, the storage system may adjust the value of y in response to performance characteristics of the write requests. In some instances, the value of y may be initially set to zero and may increase in response to slow write requests or degraded performance of the storage system. In instances where n+k+k' chunks are generated, the value of y may initially be equal to k' and may decrease in response to write requests consistently completing successfully. Additionally, the value of y may vary based on a number of storage devices in the storage system. For example, the value of y may increase as more storage devices are added to the storage system and decrease as the number of storage devices decreases. In instances where redundant write requests are reactively generated, the value of y varies based on the number of write requests that fail to acknowledge with a time threshold. As described in more detail at block 514, the storage system may also adjust the threshold in response to performance characteristics which may affect the value of y. After the storage system generates the y redundant write requests, control flows to block 510.

At block 510, the storage system sends write requests to the storage devices. The storage system sends the write requests and any redundant write requests to different storage devices. The write requests are sent in a manner similar to that described at block 408 of FIG. 4. After the storage system sends the write requests to the storage devices, control flows to block 512.

At block 512, the storage system records and analyzes performance characteristics related to storing the selected object. The performance characteristics can include information such as the time taken to complete each write request or a minimum number of write requests, which storage devices acknowledged the quickest, an amount of storage space in the storage devices, etc. In instances where redundant write requests are reactively generated, the performance characteristics can include a number of redundant write requests that were generated. The storage system records the performance characteristics so that performance characteristics related to storing the plurality of objects or performance characteristics related to each of the storage devices may be compared. The storage system may indicate in the performance characteristics the values of the threshold, x, and y so that performance patterns in relation to the values of the threshold, x and y can be determined. For example, the storage system may determine that a certain combination of x and y values resulted in faster object storage times. The storage system may analyze the performance characteristics to determine if performance thresholds were met. For example, the storage system may ensure that the selected object was stored within an amount of time. After the storage system records and analyzes the performance characteristics, control flows to block 514.

At block 514, the storage system adjusts the values of x, y, and the threshold based on the performance characteristics. The storage system may use machine learning algorithms, such as classification algorithms or anomaly detection algorithms, to dynamically adjust the values of x, y, and the threshold. The storage system may also use machine learning algorithms to detect slow storage devices connected to the storage system and then prioritize those storage devices that provide consistently better performance for write requests at block 510. The values of x, y, and the threshold may also be adjusted based on specific performance characteristics. For example, the storage system may increase the number of redundant write requests y or decrease the time threshold in response to the selected object not storing within a desired period of time. Since the storage system uses the fastest writes to acknowledge, increasing the redundant write requests or decreasing the time threshold decreases the chances of delay in the storage process. The storage system may decrease the values of x and y and increase the value of the threshold in response to determining that additional overhead incurred when generating a high number of chunks and redundant write requests is degrading system performance. The storage system may also decrease y if there is a high number of pending write requests for the storage devices. The storage system may adjust the value of x in response to increasing or decreasing the value of y as more or less chunks may be needed for the redundant write requests. Conversely, the storage system may adjust the value of y in response to increasing or decreasing the value of x as more or less redundant write requests may be needed for the x chunks. To accommodate the adjusted x and y values, the storage system may also adjust the technique for generating chunks. For example, the storage system may adjust a rate for an erasure code to generate additional chunks or may adjust the size of the chunks. After the storage system adjusts the x and y values, control flows to block 516.

At block 516, the storage system determines if there is an additional object in the plurality of objects. If there is an additional object, the storage system selects the additional object at block 502. If there is not an additional object, the process ends.

Variations

The flowcharts are provided to aid in understanding the illustrations and are not to be used to limit scope of the claims. The flowcharts depict example operations that can vary within the scope of the claims. Additional operations may be performed; fewer operations may be performed; the operations may be performed in parallel; and the operations may be performed in a different order. For example, the operations depicted in blocks 420 and 422 of FIG. 4 can be performed in parallel, concurrently, in reverse order, etc. Additionally, the operations depicted in block 514 of FIG. 5 may not be performed in some iterations. It will be understood that each block of the flowchart illustrations and/or block diagrams, and combinations of blocks in the flowchart illustrations and/or block diagrams, can be implemented by program code. The program code may be provided to a processor of a general purpose computer, special purpose computer, or other programmable machine or apparatus.

Some operations above iterate through sets of items, such as objects. In some instances, objects may be iterated over according to a time they were received, a priority indicator, size, etc. Also, the number of iterations for loop operations may vary. Different techniques for processing and storing objects may require fewer iterations or more iterations. For example, objects may be stored in parallel, reducing the number of iterations. Additionally, a loop may not iterate for each object. For example, objects may be deduplicated.

In some instances in the description above, a redundant write request is generated in response to an initial write request not completing within a threshold. Instead of waiting for a threshold to expire, redundant write requests may also be generated in response to determining that a storage device is unable to complete a write request. A storage device may be unable to complete a write request if the storage device is full, malfunctioning, corrupted, non-operational, etc.

In the description above, redundant write requests and storage of objects are isolated to a single storage system however this may not always be the case. In some instances, objects may be stored across multiple storage systems, clusters, or nodes. Similarly, redundant write requests may span multiple storage systems, clusters, or nodes. The write manager or some bookkeeping component external to the storage system may track the various storage locations and update the index with information for locating the chunks.

The variations described above do not encompass all possible variations, aspects, or features. Other variations, modifications, additions, and improvements are possible.

The examples often refer to a "write manager." The write manager is a construct used to refer to implementation of functionality for generating and monitoring writes of a storage system. This construct is utilized since numerous aspects or features are possible. A write manager may be a particular component or components of a machine (e.g., a particular circuit card enclosed in a housing with other circuit cards/boards), machine-executable program or programs, firmware, a circuit card with circuitry configured and programmed with firmware for generating write requests, etc. The term is used to efficiently explain content of the disclosure. The write manager can also be referred to as write controller, write component, write generator, etc. Although the examples refer to operations being performed by a write manager, different entities can perform different operations. For instance, a dedicated co-processor or application specific integrated circuit can generate and monitor writes of a storage system.

As will be appreciated, aspects of the disclosure may be embodied as a system, method or program code/instructions stored in machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations can be organized differently in accordance with any one of platform (operating system and/or hardware), application ecosystem, interfaces, programmer preferences, programming language, administrator preferences, etc.

Any combination of machine readable medium(s) may be utilized. The machine readable medium may be a machine readable signal medium or a machine readable storage medium. A machine readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine readable storage medium may be any tangible medium that can contain, or store a program for use by or in connection with an instruction execution system, apparatus, or device. A machine readable storage medium is not a machine readable signal medium.

A machine readable signal medium may include a propagated data signal with machine readable program code embodied therein, for example, in baseband or as part of a carrier wave. Such a propagated signal may take any of a variety of forms, including, but not limited to, electromagnetic, optical, or any suitable combination thereof. A machine readable signal medium may be any machine readable medium that is not a machine readable storage medium and that can communicate, propagate, or transport a program for use by or in connection with an instruction execution system, apparatus, or device.

Program code embodied on a machine readable medium may be transmitted using any appropriate medium, including but not limited to wireless, wireline, optical fiber cable, RF, etc., or any suitable combination of the foregoing.

Computer program code for carrying out operations for aspects of the disclosure may be written in any combination of programming languages, including an object oriented programming language such as the Java® programming language, C++ or the like; a dynamic programming language such as Python; a scripting language such as Perl programming language or PowerShell script language; and conventional procedural programming languages, such as the "C" programming language or similar programming languages. The program code may execute entirely on a stand-alone machine, may execute in a distributed manner across multiple machines, and may execute on one machine while providing results and or accepting input on another machine.

The program code/instructions may also be stored in a machine readable medium that can direct a machine to function in a particular manner, such that the instructions stored in the machine readable medium produce an article of manufacture including instructions which implement the function/act specified in the flowchart and/or block diagram block or blocks.

Figure 6:
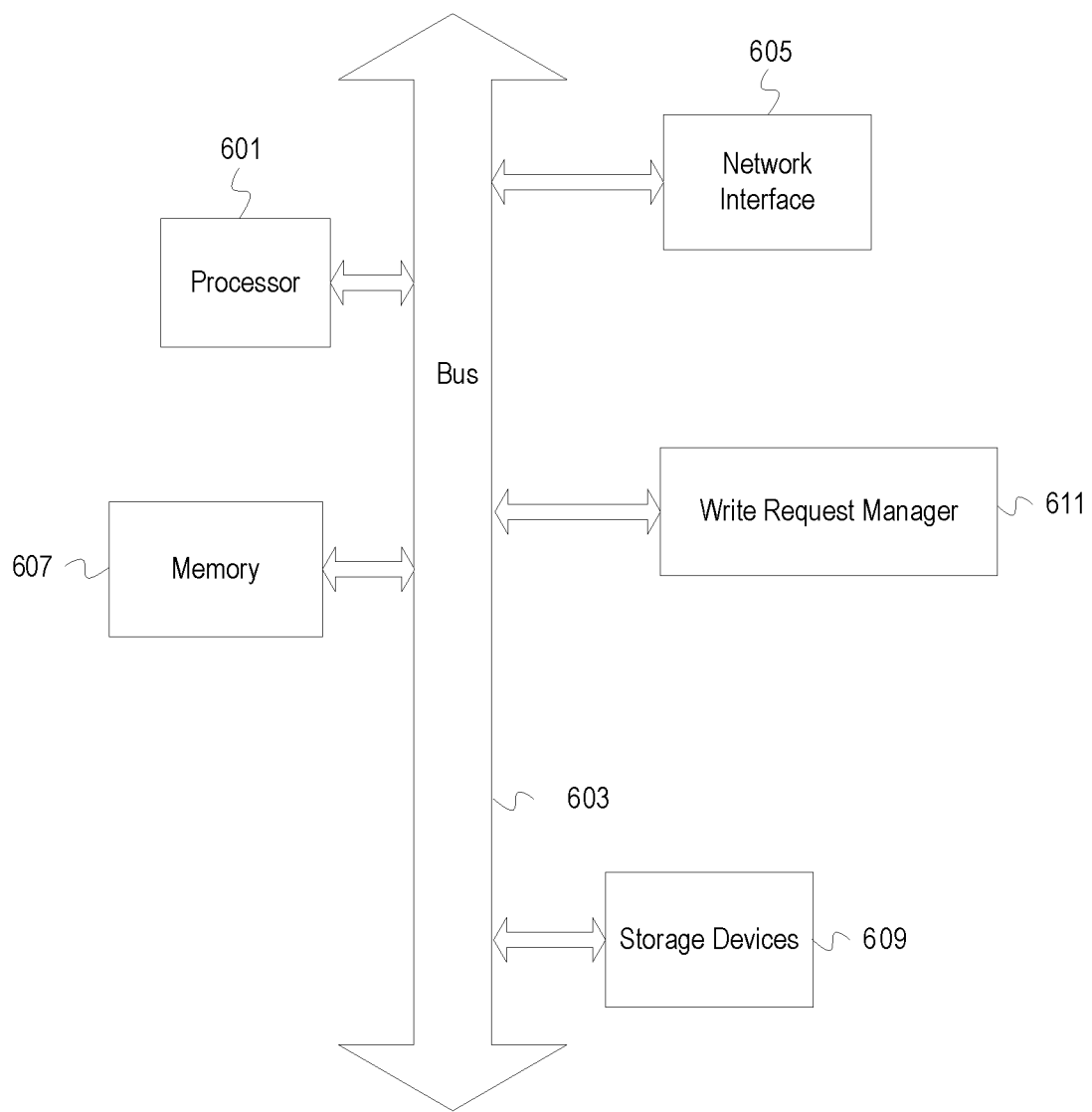
FIG. 6 depicts an example computer system with a redundant write manager.

FIG. 6 depicts an example computer system with a write request manager. The computer system includes a processor 601 (possibly including multiple processors, multiple cores, multiple nodes, and/or implementing multi-threading, etc.). The computer system includes memory 607. The memory 607 may be system memory (e.g., cache, SRAM, DRAM, zero capacitor RAM, Twin Transistor RAM, eDRAM, EDO RAM, DDR RAM, EEPROM, NRAM, RRAM, SONOS, PRAM, etc.) or any of the above already described possible realizations of machine-readable media. The computer system also includes storage devices 609. The storage devices 609 may be local or remote storage (e.g., a hard disk or hard disk array, a diskette, an optical storage device, a magnetic storage device, Network Attached Storage (NAS), Storage Area Network (SAN), all flash array, RAID configured storage) or any of the above already described possible realizations of machine-readable media. The computer system also includes a bus 603 (e.g., PCI, ISA, PCI-Express, HyperTransport® bus, InfiniBand® bus, NuBus, etc.) and a network interface 605 (e.g., a Fiber Channel interface, an Ethernet interface, an internet small computer system interface, SONET interface, wireless interface, etc.). The system also includes a write request manager 611. The write request manager 611 generates redundant write requests and records locations for chunks of an object stored in a storage system. Any one of the previously described functionalities may be partially (or entirely) implemented in hardware and/or on the processor 601. For example, the functionality may be implemented with an application specific integrated circuit, in logic implemented in the processor 601, in a co-processor on a peripheral device or card, etc. Further, realizations may include fewer or additional components not illustrated in FIG. 6 (e.g., video cards, audio cards, additional network interfaces, peripheral devices, etc.). The processor 601 and the network interface 605 are coupled to the bus 603. Although illustrated as being coupled to the bus 603, the memory 607 may be coupled to the processor 601.

Figure 7:
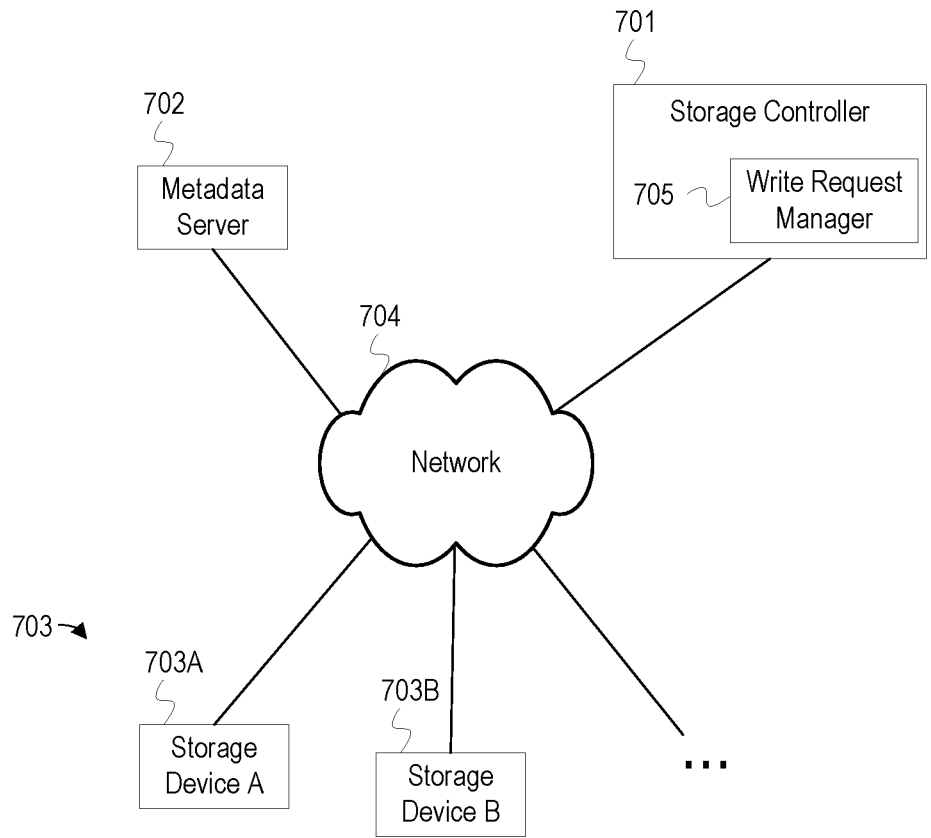
FIG. 7 depicts an example distributed storage system with a storage controller that includes a write request manager.

FIG. 7 depicts an example distributed storage system with a storage controller that includes a write request manager. The distributed storage system includes a storage controller 701, a metadata server 702, and storage devices 703 which are connected through a network 704. The network 704 may be local area network or wide area network and may include network devices such as routers, gateways, firewalls, switches, etc. The storage controller 701, the metadata server 702, and the storage devices 703 may communicate through the network 704 using various network protocols such as HTTP, iSCSI, and any of the above already described possible protocols. As indicated by the ellipses, the storage devices 703 may include number of network connected storage devices in addition to the storage device A 703A and the storage device B 703B. The storage controller 701 includes a write request manager 705. The write request manager 705 generates redundant write requests that are sent through the network 704 to the storage devices 703. The write request manager 705 determines locations for chunks of an object stored throughout the distributed storage system and records the locations in the metadata server 702. The metadata server 702 may be a database or other storage device that maintains locations of objects stored in the distributed storage system.

While the aspects of the disclosure are described with reference to various features and exploitations, it will be understood that these aspects are illustrative and that the scope of the claims is not limited to them. In general, techniques for reducing write tail latency using redundant write requests as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

What is claimed is:

1. A method comprising:
identifying, by a computing device, a subset from a first set of data units associated with a plurality of completed write requests when a determined first minimum number of the completed write requests sent with the first set of data units to one of a plurality of storage devices are identified to be completed, wherein the first set of data units is generated based on a received first object and wherein the determined first minimum number of the write requests is equal to a second minimum number of data units required to reconstruct the received first object;
identifying, by the computing device, a location for each data unit in the identified subset of the first set of data units; and
updating, by the computing device, an index with an identifier for the received first object and the identified location of each of the identified subset of the first set of data units.

2. The method as set forth in claim 1, further comprising generating, by the computing device, a second set of data units equal to a determined number of additional data units to be generated for a received second object to be stored.

3. The method as set forth in claim 2, wherein the generating the second set of data units further comprises modifying, by the computing device, a determined erasure code to generate a number of new data units equal to the determined number of additional data units to be generated.

4. The method as set forth in claim 1 further comprising cancelling, by the computing device, remaining write requests corresponding to the first set of data units that are pending.

5. A non-transitory machine readable medium having stored thereon instructions for storing an object comprising machine executable code which when executed by at least one machine, causes the machine to:
identify a subset from a first set of data units associated with a plurality of completed write requests when a determined first minimum number of the completed write requests sent with the first set of data units to one of a plurality of storage devices are identified to be completed, wherein the first set of data units is generated based on a received first object and wherein the determined first minimum number of the write requests is equal to a second minimum number of data units required to reconstruct the received first object;
identify a location for each data unit in the identified subset of the first set of data units; and
update an index with an identifier for the received first object and the identified location of each of the identified subset of the first set of data units.

6. The medium as set forth in claim 5 further comprising, generating a second set of data units equal to a determined number of additional data units to be generated for a received second object to be stored.

7. The medium as set forth in claim 6 wherein the generating the second set of data units further comprises modifying a determined erasure code to generate a number of new data units equal to the determined number of additional data units to be generated.

8. The medium as set forth in claim 5 further comprising, cancelling remaining write requests corresponding to the first set of data units that are pending.

9. A computing device comprising:
   a memory including machine readable medium comprising machine executable code having stored thereon instructions storing an object; and
   a processor coupled to the memory, the processor configured to execute the machine executable code to cause the processor to:
      identify a subset from a first set of data units associated with a plurality of completed write requests when a determined first minimum number of the completed write requests sent with the first set of data units to one of a plurality of storage devices are identified to be completed, wherein the first set of data units is generated based on a received first object and wherein the determined first minimum number of the write requests is equal to a second minimum number of data units required to reconstruct the received first object;
      identify a location for each data unit in the identified subset of the first set of data units; and
      update an index with an identifier for the received first object and the identified location of each of the identified subset of the first set of data units.

10. The computing device as set forth in claim 9 wherein the processor is further configured to execute the machine executable code to further cause the processor to generating a second set of data units equal to a determined number of additional data units to be generated for a received second object to be stored.

11. The computing device as set forth in claim 10 wherein the processor is further configured to execute the machine executable code to further cause the processor wherein the generating the second set of data units further comprises modifying a determined erasure code to generate a number of new data units equal to the determined number of additional data units to be generated.

12. The computing device as set forth in claim 9 wherein the processor is further configured to execute the machine executable code to further cause the processor to cancel remaining write requests corresponding to the first set of data units that are pending.

* * * * *